(12) United States Patent
Bast et al.

(10) Patent No.: US 6,307,306 B1
(45) Date of Patent: Oct. 23, 2001

(54) PIEZO ACTUATOR WITH IMPROVED ELECTRICAL CONTACTING AND EMPLOYMENT OF SUCH A PIEZO ACTUATOR

(75) Inventors: Ulrich Bast, Munich (DE); Dieter Cramer; Gerald Kainz, both of Graz (AT); Carsten Schuh, Baldham (DE); Andreas Wolff, Munich (DE); Karl Lubitz, Ottobrunn (DE)

(73) Assignees: Siemens Aktiengesellschaft; Siemens Matsushita Components GmbH & Co. KG, both of Munich (DE)

( * ) Notice: Subject to any disclaimer, the term of this patent is extended or adjusted under 35 U.S.C. 154(b) by 0 days.

(21) Appl. No.: 09/369,604

(22) Filed: Aug. 6, 1999

(30) Foreign Application Priority Data

Aug. 6, 1998 (DE) .............................. 198 35 644
Jul. 2, 1999 (DE) .............................. 199 30 585

(51) Int. Cl.⁷ ...................................... H01L 41/04
(52) U.S. Cl. ........................... 310/366; 310/365; 310/363
(58) Field of Search .................... 310/328, 365, 310/366, 345, 348, 363

(56) References Cited

U.S. PATENT DOCUMENTS

6,037,702 * 3/2000 Tamai .............................. 310/323.06
6,104,129 * 8/2000 Okamoto ............................ 310/366

FOREIGN PATENT DOCUMENTS

33 30 538 A1   3/1985 (DE).
197 15 488
          C1   6/1998 (DE).

* cited by examiner

*Primary Examiner*—Nestor Ramirez
*Assistant Examiner*—Peter Medley
(74) *Attorney, Agent, or Firm*—Schiff Hardin & Waite

(57) ABSTRACT

A piezo actuator (1) is disclosed that has a contact lug (20, 21) for the electrical contacting of an electrode (14, 15) of an actuator member (11). Due to an expansion and contraction of the actuator member, a mechanical stress occurs in the contact lug that is minimized in that the contact lug has a device for adapting the expanse to a dimension of the expansion and contraction. The device is, for example, a deformation material in the form of a wire weave. The piezo actuator is utilized for the drive of an injection valve in an internal combustion engine.

19 Claims, 3 Drawing Sheets

PIEZO ACTUATOR WITH IMPROVED ELECTRICAL CONTACTING AND EMPLOYMENT OF SUCH A PIEZO ACTUATOR

BACKGROUND OF THE INVENTION

The present invention is directed to a piezo actuator that comprises an electrically conductive contact lug for electrical contacting of an electrode. An employment of such a piezo actuator is also recited.

A piezo actuator is usually constructed of a plurality of piezo elements arranged to form a stack-shaped actuator member. Each piezo element is composed of a piezo ceramic layer that is provided with a metallic electrode at both sides. When an electrical voltage is applied to these electrodes, then the piezo ceramic layer reacts with a lattice distortion. As a result thereof, the piezo element expands and contracts and, thus, the actuator member expands and contracts in a direction that is determined by the arrangement of the piezo ceramic layer and of the electrodes of a piezo element. A usable modification of an expansion of a stack-shaped actuator member occurs according to an extent of the expansion and contraction.

German reference DE 197 15 488 discloses such a piezo actuator. The piezo actuator has an actuator member with a multi-layer structure comprising at least one stack of alternating electrode and piezo ceramic layers. One electrode layer serves neighboring piezo ceramic layer as electrode. To that end, an electrical contacting of the electrode layers ensues in an alternating polarity. The alternating polarity is achieved with the assistance of two metallization strips that are laterally applied to the actuator member. A metallization strip extends over a height that derives from electrically active layers of the actuator member stacked on top of one another. One of the metallization strips is electrically conductively connected to each second electrode layer and is insulated from each first electrode layer lying therebetween. By contrast thereto, the second metallization strip is insulated from every second electrode layer and electrically conductively connected to each first electrode layer.

In order to ensure the electrical contacting of every individual electrode layer, a voltage supply to a metallization strip in the known piezo actuator ensues via a strip-shaped, electrically conductive contact lug in the form of a plastic film laminated with copper. The contact lug is thereby soldered to a metallization strip via one of its edges. The contact lug likewise extends over the entire height of the electrically active layer of the actuator member. An outside edge of the contact lug pointing away from the actuator member is connected to a rigid electrical terminal element. A crack in a metallization strip that potentially occurs is electrically bridged with the assistance of the contact lug. As a result thereof, the piezo actuator exhibits a high plurality of cycles and, thus, a high service life. One cycle comprises a one-time expansion and contraction of the piezo actuator or, respectively, of the actuator member in a specific direction.

SUMMARY OF THE INVENTION

It is an object of the present invention to provide a piezo actuator that comprises an even more improved electrical contacting compared to a known piezo actuator and, thus, exhibits an even greater number of cycles and longer service life.

For achieving the object, a piezo actuator comprises an actuator member for an expansion and contraction in a specific direction and at least one electrically conductive contact lug secured to the actuator member that has a dimension or an expanse in the specific direction with an improvement of the contact lug having means for adapting the expanse or the dimension of the lug to a change of dimension or size of the actuator member due to the expansion and contraction.

Corresponding to the extent of the expansion and contraction of the actuator member during a cycle, a change in an expanse of the actuator member in the specific direction occurs. The expanse comprises, for example, a height of the actuator member. Due to this change, a mechanical stress can occur in the contact lug that is secured to the actuator member.

These mechanical stresses are particularly great, for example, when a crack due to a polarization of the piezo actuator has arisen (polarization crack) in a region of the metallization strips in which the actuator member is piezo electrically inactive. A relatively great change of a dimension of the actuator member occurs at such a crack during the expansion and contraction. High mechanical stresses in the contact lug occur due to these great changes, particularly when the contact lug is rigidly connected to a rigid electrical terminal element.

The underlying idea of the invention is to reduce this mechanical stress in the contact lug. This succeeds in that the expanse or dimension of the contact lug during operation of the actuator member is automatically adapted to the constantly changing expanse or size of the actuator member. The adaptation thereby particularly ensues in a contacting region of the contact lug in which the contact lug is secured to the actuator member.

The adaptation in view of the mechanical stress in the contact lug can ensue at a maximum, minimum or medium extent of the expansion and contraction of the actuator member. This is dependent on the application and on the means that is utilized therefor.

In a particular development, the piezo actuator is characterized in that the actuator member comprises a surface at which at least one electrode is arranged, the contact lug is electrically connected to the electrode and is secured to at least two points of the surface, a spacing between the points is dependent on the expansion and contraction, the contact lug comprises the means at least between the two points and the means comprises a deformation material.

The points are preferably a component part of a planar surface and are arranged successively along the direction defined by the expansion and contraction. The points, however, can also be arranged deviating from this direction. The surface can likewise be fashioned arcuate or in some other way.

In particular, there are a plurality of points at which the contact lug is secured to the actuator member. In this way, for example, the contact lug is secured to the actuator member along an entire edge of the contact lug. In particular, the plurality of points at the surface is aligned along the direction of the expansion and contraction of the actuator member.

The spacing between two points is dependent on an electrical voltage that is applied to the electrodes of the actuator member and, thus, on the expansion and contraction of the actuator member. Due to the variable spacing from one point to another, the contact lug has a means, particularly between the points, that is suitable for adapting the expanse of the contact lug to the extent of the expansion and contraction.

The means or, respectively, the entire contact lug is, for example, a metallic leaf spring that is mechanically secured to a few points of the surface of the actuator member along an edge of the leaf spring. The points are arranged deviating from the direction in which the actuator member expands and contracts. Given expansion and contraction of the actuator member, the leaf spring bends as a result thereof. The expanse of the leaf spring in the direction in question is adapted to the extent of the expansion and contraction. The electrodes of the actuator member to be contacted are only electrically connected to the leaf spring by a touch contact. The electrodes are arranged such at the surface that the electrical contact remains preserved when the leaf spring bends.

In a particular development of the invention, the means comprises a deformation material that can be elastically and/or plastically deformed. This property is preferably not limited to the direction determined by the expansion and contraction of the actuator member. A movement within the contact lug in this direction simultaneously leads to a tensile force that can extend in any direction and over the entire contact lug. It is therefore especially advantageous when the means is deformable with respect to every spatial direction.

In a particular development, the piezo actuator is characterized in that a rigid electrical terminal element is secured to the contact lug, so that the surface of the actuator member and the terminal element are directly connected by the contact lug. For example, the contact lug is secured to the surface of the actuator member via an edge. The rigid electrical terminal element is secured to an outside edge pointing away from the surface of the actuator member. This terminal element serves the purpose of an electrical contacting of the contact lug and, thus, of an electrical contacting of the electrode layers. For example, it is aligned nearly parallel to the surface or, respectively, to the direction of the expansion and contraction and comprises a greater height than the actuator member. The terminal element thus projects beyond the actuator member in the direction of the expansion and contraction. The terminal element, however, can also be attached to an arbitrary, electrically conductive surface of the contact lug.

The contact lug particularly comprises the deformation material in the contacting region. In a particular development, the piezo actuator is characterized in that the deformation material extends at least from the surface of the actuator member up to the terminal element. In a further development, however, it can also extend over the entire contact lug. The deformation material can also be localized given a rigid electrical terminal element. Mechanical stresses in fact occur in the contact lug during operation. These, however, are diminished up to the terminal element.

In a particular development, the deformation material comprises a plurality of wires. The deformation material, for example, is a flexible wire weave. A plurality of thin wires are woven or interlaced with one another in a wire weave.

The wire weave is advantageously dimensioned such that every electrode to be contacted is electrically and mechanically contacted at the same time. An individual wire is so thin that the material of the wire remains elastic given an operationally caused deformation, and that no strength-diminishing modification of material occurs (for example, embrittlement). A wire has a diameter, for example, of a few $\mu$m. The wire weave is thus composed of such a great plurality of individual wires that each electrode always remains contacted even given a potentially occurring crack of a metallization strip or of an individual wire.

A mobility of a wire weave can be enhanced particularly in that a plurality of wires proceeding parallel to the direction of the expansion and contraction (woof threads) are removed from the weave. What is thereby achieved is that the remaining wires are arranged essentially parallel to one another. In a particular development, an individual wire is no longer stranded with other wires in this way. An especially high mobility is achieved in that a wire also comprises no point of intersection or, respectively, contact with other wires. All wires are thus arranged approximately parallel to one another. When this form of weave extends over the entire contact lug and the contact lug is connected to an electrical terminal element that exhibits at least the height of the actuator member, the electrical contacting of the electrodes ensues quasi via a wire brush in this way.

In addition to the described forms, any wire weave that allows a wire of the wire weave an optimally great latitude for movement and that thus limits the creation of a tensile force in the wire is conceivable. For example, a smooth weave (1:1 weave) or a twilled weave (2:2 weave) comes into consideration as pattern (woven type) of a wire weave. An individual wire can be approximately circular or elliptical in cross section. A calendered embodiment of the wire is likewise conceivable.

The deformation material preferably comprises an electrically conductive material, particularly an electrically conductive material that comprises at least one substance selected from the group of aluminum, iron, copper, carbon fiber and/or brass. A carbon fiber exhibits low material fatigue and therefore especially suited for an application wherein an extreme stress reversal must be achieved. A wire composed of a stainless steel can be fashioned especially thin and nonetheless meet the demand for high elasticity or, respectively, loadability.

The contact lug or, respectively, the means of the contact lug is preferably attached to the surface of the actuator member with the assistance of an electrically conductive connecting means. The connecting means functions as mechanical fastening and simultaneously produces the electrical contact between an electrode and the contact lug.

It is advantageous in this context when the surface of the actuator member comprises a metallization. The metallization, for example in the form of a metallization strip, serves the purpose of a reliable electrical contacting of an electrode. The contact lug can also be directly attached to the surface with the assistance of the connecting means, i.e. can be directly attached to each electrode to be contacted.

The connecting means can be a solder. This solution particularly lies at hand for copper that can be very easily soldered with a soft solder. Given employment of a means of stainless steel, the connecting means comprises, for example, a welding material. Another possibility is comprised in the employment of a conductive adhesive. For example, a conductive adhesive contains electrically conductive balls. The density and size of the balls in the conductive adhesive is thereby selected such that an electrical contact between the contact lug and each individual electrode layer is present at all times. A conductive adhesive is particularly suited for aluminum and for carbon fiber.

It can be advantageous for an application of the piezo actuator when the piezo actuator including an appertaining contact lug and a corresponding terminal element is positively locked to an insulating compound. Despite this measure, the contact lug, but particularly every individual wire of a deformation material, should have an optimally great latitude for movement. This succeeds in that the contact lug comprises a coating. The coating can thereby be limited to the region of the contact lug that comprises the deformation material. The coating prevents an adherence-actuated contact between the contact lug and the insulating compound. In this case, the coating is composed, for example, of a low-viscosity material that functions as parting agent. Another solution is comprised in using an elastic, particularly highly elastic material as coating of the contact lug. This material, for example, comprises a silicone elastomer. The coating can be fashioned as elastic envelope of only the contact lug. A positive union of a piezo actuator, including its terminal elements and contact lugs, and a highly elastic insulating compound is especially advantageous. In this composite, the insulating compound simultaneously serves as coating of the contact lug.

The material of a coating can only moisten one surface of the means for adapting the expanse of the contact lug to the expansion and contraction of the actuator member. Particularly given a deformation in the form of a wire weave, the coating can also additionally fill out an interspace between a plurality of wires (mesh).

The coating harbors an additional advantage: it can serve as a damping of a vibration in the piezo actuator that possibly occurs during operation of the piezo actuator. Such a vibration can contribute to a crack formation and to a propagation of a crack in the piezo actuator. The anticipated number of cycles of the piezo actuator increases with a coating that damps an occurring vibration.

An arbitrary PZT ceramic (lead zirconate titanate) can be utilized as ceramic of the actuator member of a pre-set piezo actuator. An electrode layer is composed of a suitable material, particularly of a silver-containing burn-in paste. An electrode layer can contain an additional acetic additive for better adhesion to a piezo ceramic layer as well as some other metal by itself or as a further additive, for example platinum or palladium.

The invention assures a reliable electrical contacting of a piezo actuator. In that the expanse of the electrically conductive contact lug constantly adapts to the changing expanse of the actuator member, the piezo actuator is distinguished by high dependability and high number of cycles. A high flexibility and bendability of the contact lug, particularly in the form of a wire weave, prevents the creation of a crack-propelling force in the contact lug. Over and above this, the nature of a wire weave largely prevents the propagation of an existing crack.

A piezo actuator disclosed here is preferably employed for driving an injection valve, particularly an injection valve of an internal combustion engine.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
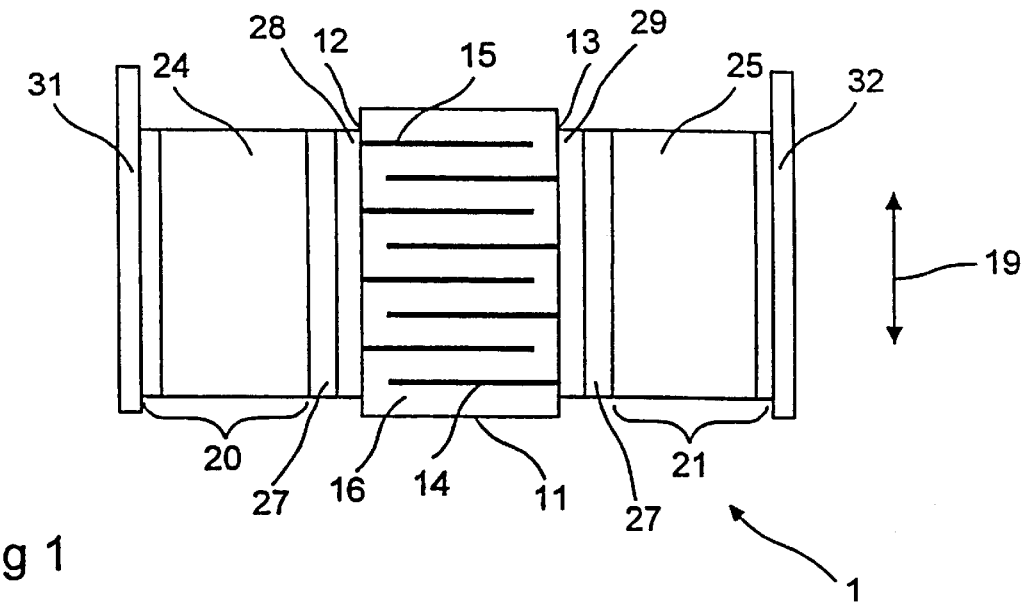
FIG. 1 shows a piezo actuator from one side.

The piezo actuator according to FIG. 1 is composed of an actuator member 11 in the form of a stack of piezo ceramic layers 16 and electrode layers 14 and 15 arranged therebetween. A piezo ceramic layer 16 is composed of a PZT material. The material of an electrode layer 14 and 15 comprises a silver-containing burn-in paste.

A respective metallization strip 28 or, respectively, 29 is attached to both lateral surfaces 12 and 13 of the actuator member 11, parallel to the direction 19 in which the expansion 17 and contraction of the actuator member 11 occurs. A metallization strip is composed of a burned-in silver paste. A respective electrically conductive contact lug 20 or, respectively, 21 is mechanically and electrically conductively connected to the metallization strip 28 and 29 of the surface 12 and 13 of the actuator member 11 via a solder 27. The connection respectively ensues over the height of the electrode layers 14 or, respectively, 15 to be contacted. Rigid electrical terminal elements 31 and 32 in the form of electrically conductive pins are soldered to the outside edges of the contact lugs 20 and 21. The terminal elements 31 and 32 project beyond the actuator member 11.

Figure 2:
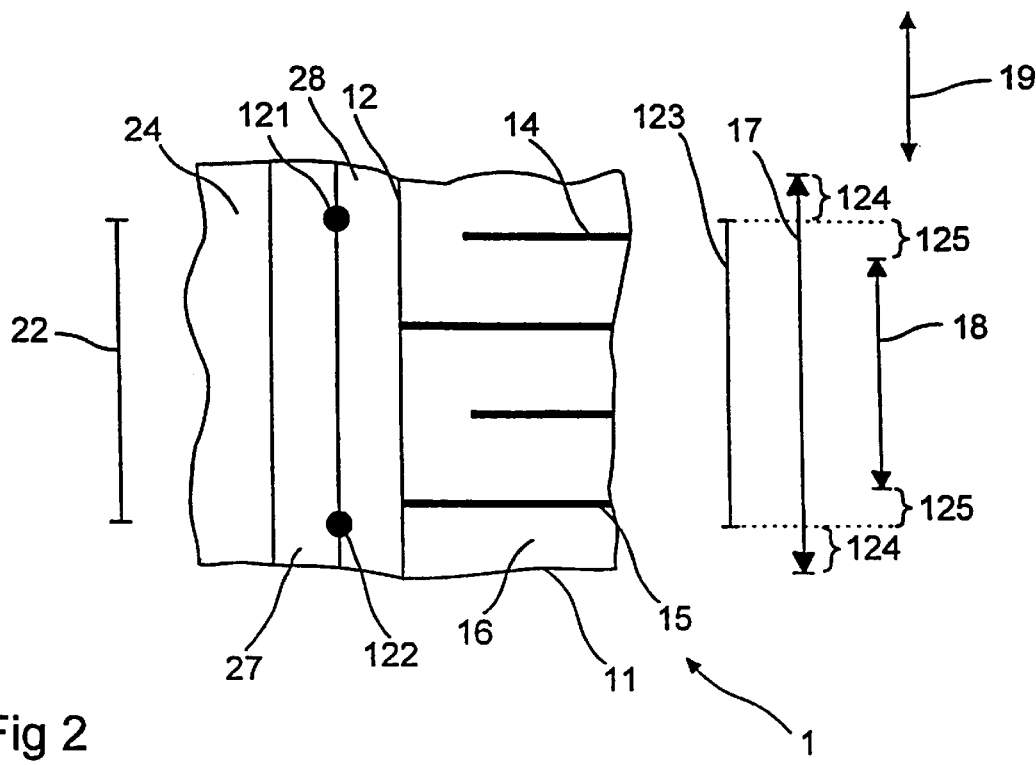
FIG. 2 shows an enlarged excerpt of the piezo actuator of FIG. 1.

FIG. 2 shows an excerpt from the piezo actuator 1 that is shown in FIG. 1. Two points 121 and 122 of an entire set of points of the surface 12 of the actuator member 11 provided with a metallization 28 are shown. The contact lug 20 is secured to the points 121 and 122. The points 121 and 122 are situated at the spacing 123 from one another. Given an expansion 17 of the actuator member 11 in the direction 19, the spacing 123 increases by the dimension 124. By contrast thereto, the spacing 123 diminishes by the dimension 125 given the contraction 18 of the actuator member 11.

The contact lug 20 or, respectively, 21 comprises at least one means 24 or, respectively, 25 for adapting the expanse 22 of the contact lug 20 and 21 to the dimension 124 and 125 of the expansion 17 and contraction 18 of the actuator member 11.

Figure 3:
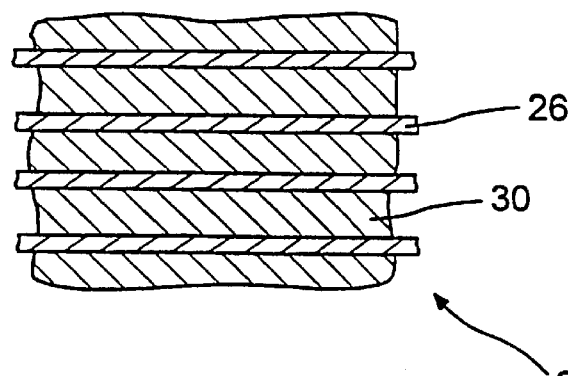
FIG. 3 shows a cross section through a deformation material in the form of wires that comprise a coating.

In the present exemplary embodiment, the means 24 or, respectively, 25 is a deformation material 241 or, respectively, 251 that comprises a plurality of wires 26. The wires 26 are arranged essentially parallel to one another. FIG. 3 shows the deformation material 241 and 251. An individual wire 26 has a nearly circular cross section. Each wire 26 is surrounded by a highly elastic coating 30 composed of a silicone elastomer. The coating 30 additionally fills the interspace between two wires 26.

The deformation material 241 or, respectively, 251 is in the position of following every change of the spacing 123 between the points 121 and 122 to such an extent that the contact lug 20 or, respectively, 21 is nearly free of mechanical stress given the expansion 17 and contraction 18 of the actuator member 11.

Figure 4:
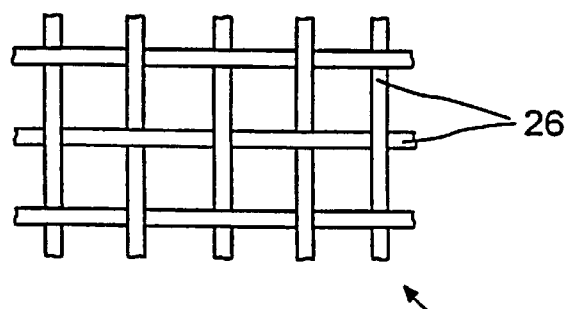
FIGS. 4 and 5 show various embodiments of the deformation material in the form of a wire weave.
Figure 5:
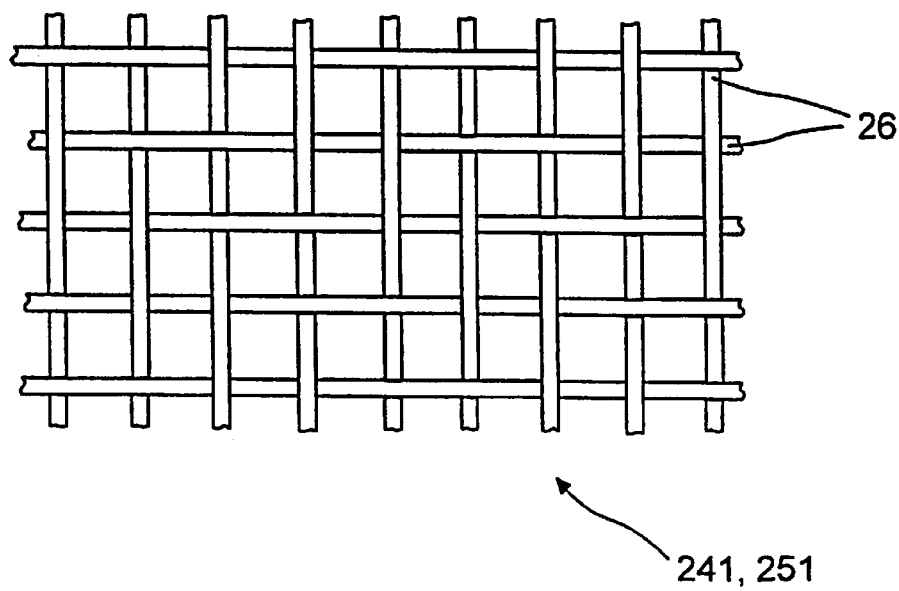

Two further exemplary embodiments of a piezo actuator 1 differ from the described exemplary embodiment on the basis of the deformation material 241 or, respectively, 251 of the contact lug 20 or, respectively, 21. A wire weave with a different type of weaving is respectively present. FIG. 3 shows a type of weaving with a smooth bond (1:1 bond, plain weave), and FIG. 4 shows one with a twilled weave (2:2 bond).

Further exemplary embodiments derive on the basis of the combination of the described features of the contact lug 20 or, respectively, 21 with the features of a piezo actuator disclosed in German reference DE 197 15 488.

Figure 6:
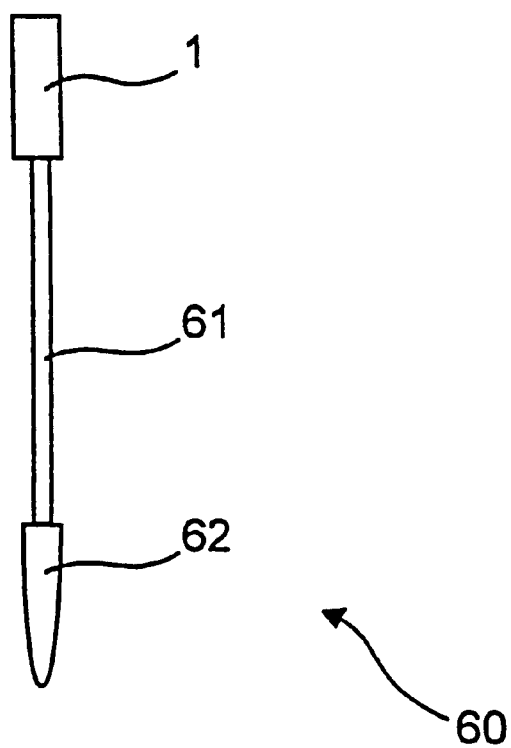
FIG. 6 shows an injection valve with a piezo actuator.

The piezo actuator is used for the drive of an injection valve 60 (FIG. 6) of an internal combustion engine. The piezo actuator 1 is thereby connected via a piston 61 to a nozzle needle 62 of the injection valve 60.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A piezo actuator comprising:

an actuator member for an expansion and contraction in a predetermined direction;

at least one electrically conductive contact lug being secured to the actuator member and having an expanse in the predetermined direction;

the contact lug having means for adapting the expanse to a change of a dimension of the actuator member due to expansion and contraction.

2. The piezo actuator according to claim 1, wherein the actuator member has a surface at which at least one electrode is arranged;

wherein the contact lug is electrically connected to the electrode and is secured to at least two points of a surface of the actuator member;

wherein a spacing between the points is dependent on the expansion and contraction;

wherein the contact lugs has the means at least between the two points; and wherein the means has a deformation material.

3. The piezo actuator according to claim 2, wherein a rigid electrical terminal element is secured to the contact lug, so that the surface of the actuator member and the terminal element are indirectly connected by the contact lug.

4. The piezo actuator according to claim 2, wherein the deformation material extends at least from the surface of the actuator member up to the terminal element.

5. The piezo actuator according to claim 2, wherein the deformation material extends over the entire contact lug.

6. The piezo actuator according to claim 2, wherein the deformation material has an electrically conductive material.

7. The piezo actuator according to claim 2, wherein the deformation material has a plurality of wires.

8. The piezo actuator according to claim 7, wherein the wires are arranged substantially parallel to one another.

9. The piezo actuator according to claim 2, wherein the deformation material has an electrically conductive material that has at least one substance selected from a group of at least one of aluminum, iron, copper, carbon fiber and brass.

10. The piezo actuator according to claim 2, wherein the surface has a metallization between the contact lug and the electrode.

11. The piezo actuator according to claim 10, wherein the metallization is a burn-in metallization.

12. The piezo actuator according to claim 1, wherein the contact lug is connected to the electrode using an electrically conductive connecting device.

13. The piezo actuator according to claim 12, wherein the connecting device is a solder.

14. The piezo actuator according to claim 12, wherein the connecting device is a welding material.

15. The piezo actuator according to claim 12, wherein the connecting device is a conductive adhesive.

16. The piezo actuator according to claim 1, wherein the contact lug is a coating.

17. The piezo actuator according to claim 16, wherein the coating is elastic.

18. The piezo actuator according to claim 16, wherein the coating is a silicone elastomer.

19. The piezo actuator according to claim 1, which is connected to a valve member of an injection valve.

* * * * *